United States Patent [19]
Liu et al.

[11] Patent Number: 5,646,057
[45] Date of Patent: Jul. 8, 1997

[54] METHOD FOR A MOS DEVICE MANUFACTURING

[75] Inventors: Chwen-Ming Liu; Jenn-Ming Huang, both of Hsinchu; Hsien-Wei Chin, Hsin Chu; Huan-Chung You, Hsin-Chu; Jang-Cheng Hsieh, Hsin-Chu, all of Taiwan

[73] Assignee: Taiwan Semiconductor Manufacturing Company, Hsinchu, Taiwan

[21] Appl. No.: 524,153

[22] Filed: Sep. 1, 1995

Related U.S. Application Data

[63] Continuation of Ser. No. 280,220, Jul. 25, 1994, abandoned.

[51] Int. Cl.$^6$ ................................................ H01L 21/8234
[52] U.S. Cl. ........................ 437/40 R; 437/27; 437/247; 148/DIG. 3
[58] Field of Search ........................ 437/40, 41, 27, 437/247; 148/DIG. 3

[56] References Cited

U.S. PATENT DOCUMENTS

| | | | |
|---|---|---|---|
| 4,113,514 | 9/1978 | Pankoue et al. | |
| 4,331,486 | 5/1982 | Chenevas-Paole et al. | |
| 4,512,073 | 4/1985 | Hsu | 437/41 |
| 4,535,532 | 8/1985 | Lancaster | 437/34 |
| 4,579,600 | 4/1986 | Shah et al. | |
| 4,888,297 | 12/1989 | Aboelfotoh et al. | 437/41 |
| 4,931,407 | 6/1990 | Maeda et al. | 437/45 |
| 5,017,508 | 5/1991 | Dodt et al. | 437/247 |
| 5,106,782 | 4/1992 | Matsuno et al. | 437/34 |
| 5,162,241 | 11/1992 | Mori et al. | 148/DIG. 160 |
| 5,356,825 | 10/1994 | Hozumi et al. | 437/918 |

FOREIGN PATENT DOCUMENTS 62-272521  11/1987  Japan.

OTHER PUBLICATIONS

Tanigaki et al, "A New Self–Aligned Contact Technology" J. Electrochem. Soc. Solid State Sci. & Tech, pp. 471–472, vol. 125, No. 3, Mar. 1978.

*Primary Examiner*—Michael Trinh
*Attorney, Agent, or Firm*—George O. Saile

[57] ABSTRACT

A method is provided for improving the performance characteristics of the MOS devices contained within an integrated circuit that has been subjected to a rapid thermal anneal. After the rapid thermal anneal the integrated circuit is heated for more than about 30 minutes at a temperature of more than about 430° C. in a gaseous atmosphere that contains hydrogen, typically forming gas.

7 Claims, 3 Drawing Sheets

METHOD FOR A MOS DEVICE MANUFACTURING

This is a continuation of application Ser. No. 08/280,220, filed on Jul. 25, 1994, now abandoned.

BACKGROUND OF THE INVENTION

(1) Field of the Invention

The present invention relates to a method for manufacturing semiconductors, in particular to a method for neutralizing the undesirable side-effects that result from a post oxide rapid thermal anneal.

(2) Description of the Prior Art

As the internal dimensions of integrated circuits grow ever smaller (less than 1 micron line width for example), the possibility of small amounts of misalignment between successively created features grows larger. Thus, for example, the contact hole etched in a passivating layer of BPSG (borophosphosilicate glass) may not align perfectly with the previously created S/D (source and drain) contact in a MOSFET (metal-oxide-semiconductor field effect transistor) device. Such misalignment can then lead to shorting of the S/D contact to the substrate. This problem is particularly severe for NMOS devices in memory where tighter design rules require a smaller cell size.

One way of overcoming shorting of the S/D contact to the substrate (that occurred as a result of misalignment) is to implant a layer of appropriate donor or acceptor atoms, using standard ion implantation methods, just below the surface of the S/D via hole. In this way, the original S/D contact is, in effect, spread out so that it covers the entire floor of the S/D via hole. Now, a metallic layer, deposited into the S/D via hole, will make contact only with the source or drain and not the underlying substrate.

As part of the standard ion implantation methods referred to above, it is necessary to activate the implanted ions. This is normally achieved by means of a suitable heat treatment, typically 30 minutes at about 850° C. Unfortunately this relatively long heating time is sufficient to allow some phosphorus to diffuse out of the passivating BPSG layer into the PMOS sections of a CMOS (complementary MOS)-type integrated circuit which leads to high contact resistance at the P+ S/D contact.

As an alternative to this approach, with its attendant problems, the implanted ions can be activated by using a rapid thermal anneal (RTA) cycle, typically 800° to 1100° C. for about 10 to 30 seconds. This is adequate for the activation of the ion implanted material without being long enough for significant phosphorus diffusion to occur.

While the RTA method is generally preferred for the activation of the N-type dopants, for the above mentioned reasons, it is subject to undesired side-effects of its own. In particular, RTA can lead to the creation of interface states in the gate oxides of the MOS devices. These interface states have a disastrous effect on the lifetime of minority carriers in a semiconductor as taught, for example, by Pankove et al (U.S. Pat. No. 4,113,514 Sep. 12, 1978). This means that, for a given applied voltage, the thickness of the depletion region underneath the gate oxide will be reduced. This, in turn, reduces the source-drain transconductance, reducing the gain of the MOS device.

This major undesirable side-effect of the RTA process (namely the creation of interface states in the gate oxides of MOS devices) can be largely eliminated by following the RTA cycle with an additional heat treatment. Devices are heated for 30 minutes at 450° C., which is substantially lower than the 800°–1100° C. range quoted earlier for the RTA, in hydrogen or in a mixture of hydrogen and an inert gas such as nitrogen.

Previously used methods for the treatment of semiconductors by heating in hydrogen have required the in situ creation of a low pressure hydrogen discharge (gas plasma). See for example Pankove et al. (U.S. Pat. No. 4,113,514 Sep. 12, 1978) or Chenevas-Paule et al. (U.S. Pat. No. 4,331,486 May 25, 1982). The method of the current invention requires neither low pressure operation nor the creation of a gaseous plasma.

SUMMARY OF THE INVENTION

It is an object of the invention to remove the interface states that are generated within the gate oxide region of MOS devices as a result of rapid thermal annealing treatment.

It is a further object of the invention to reduce leakage currents through N+ as well as P+ source and drain contacts that are subject to increases as a result of rapid thermal annealing treatment.

These objects are achieved according to the present invention by heating the MOS devices in a gaseous environment that includes hydrogen, typically forming gas.

DESCRIPTION OF THE PREFERRED EMBODIMENTS

Figure 1:
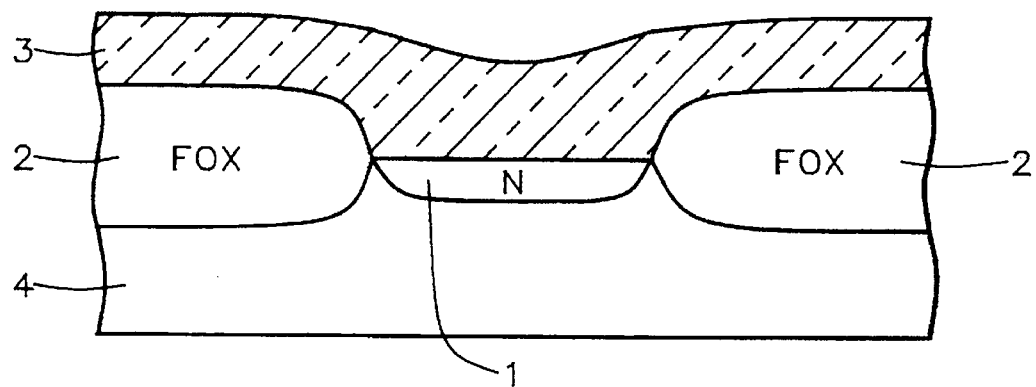
FIG. 1 shows an N-type region within a semiconductor body located between two oxide regions and covered with a layer of borophosphosilicate glass.

Referring now to FIG. 1, we show a cross-section through a P type silicon substrate 4 on whose surface has been defined an N type region 1 that is located between two regions of field oxide 2 and covered by a layer of BPSG (borophosphosilicate glass) 3.

Figure 2:
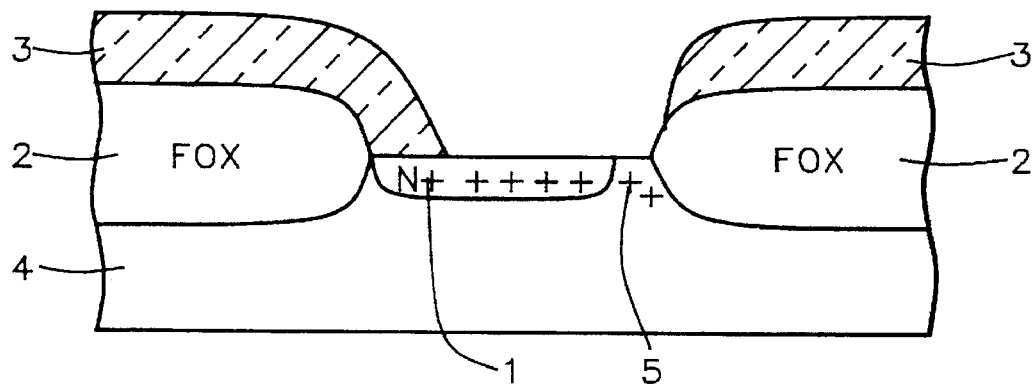
FIG. 2 shows the effects of misaligning a hole etched in the borophosphosilicate glass down to the N-type region.

FIG. 2 illustrates the consequences of misaligning a hole that was etched in the BPSG down to the N region—a part of the P region has now been exposed. To deal with this, a region 5 of N-type dopant ions is implanted, thereby extending the N region 1 to the edge of oxide 2. This must then be followed by a suitable heat treatment to activate the implanted ions, typically 30 minutes at about 850° C. Unfortunately this relatively long heating time is sufficient to allow some phosphorus to diffuse out of the passivating BPSG layer into the PMOS sections of a CMOS-type integrated circuit which leads to high contact resistance at the P+ S/D contact.

As an alternative to this approach, and its associated problems, the ion implanted atoms can be activated by using a RTA cycle, typically 800° to 1100° C. for about 10 to 30 seconds. This is adequate for the activation of the ion implanted material without being long enough for significant phosphorus diffusion to occur.

While the RTA method is generally preferred for the activation of the N-type dopants, for the above mentioned reasons, it is subject to undesired side-effects of its own. In particular, a RTA can lead to the creation of interface states in the gate oxides of the MOS devices. These interface states have a disastrous effect on the lifetime of minority carriers in a semiconductor.

What the present invention teaches is that the aforementioned undesired side-effects, introduced as a result of the rapid thermal anneal treatment, can be almost entirely eliminated by introducing an additional heat treatment step into the process. After the RTA, the integrated circuit is heated for between 30 to 120 minutes at between about 450° to 500° C. (which is substantially lower than the 800°–1100° C. range quoted earlier for the RTA) in an atmosphere of forming gas (10% H2 and 90% N2). It should be understood that the quoted gas composition is only approximate and that hydrogen alone will also work, although forming gas is preferred.

Figure 3:
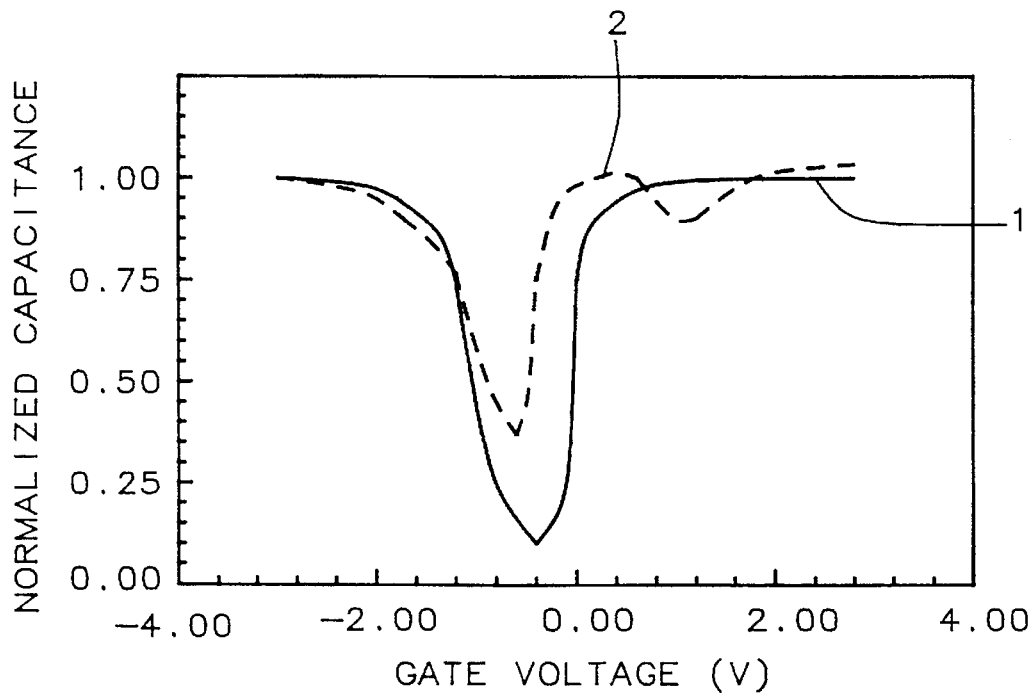
FIG. 3 shows the effects of a Rapid Thermal Anneal treatment on the capacitance vs. voltage curve of an MOS device.

Referring now to FIG. 3, we show a pair of normalized curves for the capacitance in the gate region of a field effect transistor as a function of applied voltage. Curve 1 was obtained prior to RTA treatment while curve 2 was obtained after RTA (1050° C. for 10 seconds in this example). The increase in the capacitance, particularly for small negative gate voltages, can be clearly seen.

Figure 4:
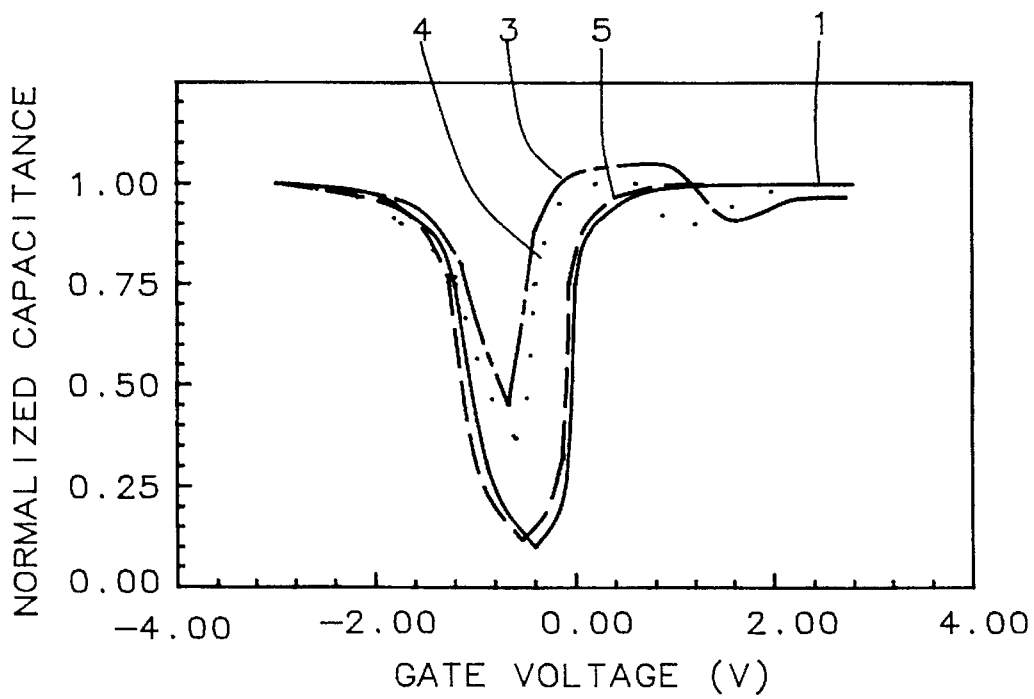
FIG. 4 shows the effect on said capacitance vs. voltage curve of providing a lower temperature heat treatment in forming gas following the RTA treatment.

In FIG. 4, curve 1 again shows the capacitance-voltage relationship prior to RTA. Curves 3, 4, and 5 show the results that were obtained following heat treatments in forming gas for 30 minutes at temperatures of 380° C., 410° C., and 450° C. respectively. As can be seen in curve 5, the 450° C. heat treatment restores the C-V curve to very close to its form prior to the RTA.

Other data, not shown here, has indicated that the temperature of the heat treatment in forming gas may be as low as 430° C. while still providing essentially all the benefits of heating at 450° C.

Figure 5:
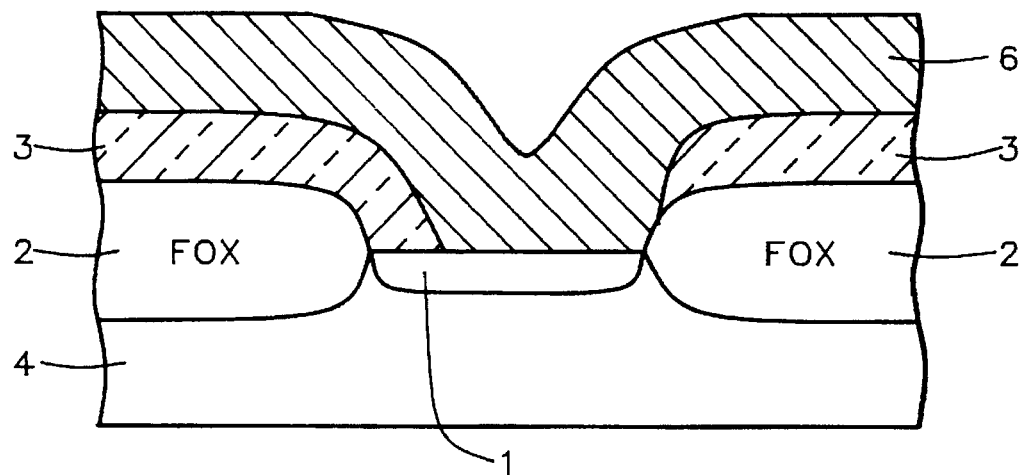
FIG. 5 shows the finished structure after the various heat treatments, including a top layer of aluminum.

Once the heat treatment in forming gas has been completed, contact to the source and drain areas can now be made via a deposited metal layer of aluminum 6 in FIG. 5.

The following examples are given to point out the important features of the present invention and to aid in the understanding thereof and variations may be made by one skilled in the art without departing from the spirit and scope of the invention:

EXAMPLES 1 THROUGH 3

Additional evidence that the overall quality of the devices had been returned to what it was prior to the RTA was found by looking at junction leakage currents. In TABLE 1 below we show examples 1 through 3 of the leakage currents that were measured in three different structures after three different types of heat treatment. Example 1, referred to as 'N+ chain', was composed of 400 sets of N+ contacts connected in series, while the N+ and P+ S/D structures (examples 2 and 3) represent the average of many leakage current measurements made through N+ and P+ sources and drains.

The three different heat treatments to which these different structures were subjected were a standard implanted ion activation treatment of 850° C. for 30 minutes in nitrogen (column 2), a RTA followed by 30 minutes at 600° C. in nitrogen (column 3), and a RTA followed by 30 minutes at 450° C. in forming gas (90% N2 10% H2). All values in TABLE 1 are for leakage currents, measured in picoamperes at an applied voltage of 5.5.

TABLE 1

| Example | 850 C. nitrogen | RTA + 600 C. nitrogen | RTA + 450 C. forming gas |
| --- | --- | --- | --- |
| N+ chain | 100 | 100 | 28.2 |
| N+ S/D | 24.5 | 16 | 1.25 |
| P+ S/D | 15 | 18 | 1.65 |

The data shown in TABLE 1 clearly illustrates the beneficial effects of forming gas over pure nitrogen and shows, furthermore, that if forming gas is used, a relatively low temperature of 450° C. is sufficient for the heat treatment.

As already stated earlier, other data, not presented here, shows that the temperature of the heat treatment in forming gas may be as low as 430° C. while still providing essentially all the benefits described above. The method is, of course, effective for temperatures above 450° C. but there is normally no reason to use these higher temperatures as they could lead to undesired side-effects of their own.

While the invention has been particularly shown and described with reference to the preferred embodiments thereof, it will be understood by those skilled in the art that various changes in form and details may be made without departing from the spirit and scope of the invention.

What is claimed is:

1. A method for manufacturing a MOS (metal-oxide-semiconductor) device comprising the following sequential steps of:

providing a silicon substrate with field oxide isolation regions and implanting ions in regions between said field oxide regions;

subjecting said silicon substrate to a rapid thermal anneal treatment and;

directly after said rapid thermal anneal, heating said MOS device in a gaseous atmosphere containing more than about 10% of hydrogen gas at a temperature between about 450° and 500° C.

2. The method of claim 1 wherein the gaseous atmosphere further comprises nitrogen, in addition to the hydrogen.

3. The method of claim 1 wherein said MOS device is heated for more than about 30 minutes.

4. A method for manufacturing a MOSFET (metal-oxide-semiconductor field effect transistor) device comprising the following sequential steps of:

providing a P type silicon substrate with field oxide that isolates N type source and drain regions;

protecting said source and drain regions with a layer of BPSG (borophosphosilicate glass);

etching via holes through said BPSG down to the surfaces of said source and drain regions;

implanting ions of an N type dopant material into the surfaces of said source and drain regions that were exposed by said etching step, thereby forming a MOSFET device;

subjecting said MOSFET device to a rapid thermal anneal;

directly after said rapid thermal anneal, heating said MOSFET device in a gaseous atmosphere containing more than about 10% of hydrogen gas at a temperature between about 450° and 500° C. and;

forming a metal contact to said source and drain regions.

5. The method of claim 4 wherein the gaseous atmosphere further comprises nitrogen, in addition to the hydrogen.

6. The method of claim 4 wherein said MOSFET device is heated for more than about 30 minutes.

7. The method of claim 4 wherein said metal contact comprises aluminum.

* * * * *